United States Patent [19]

Andow et al.

[11] 4,370,571
[45] Jan. 25, 1983

[54] RELAY DEVICE

[75] Inventors: Fumio Andow, Hachioji; Norio Fujisawa, Fuchu, both of Japan

[73] Assignee: Tokyo Shibaura Denki Kabushiki Kaisha, Kanagawa, Japan

[21] Appl. No.: 109,552

[22] Filed: Jan. 4, 1980

[30] Foreign Application Priority Data

Mar. 20, 1979 [JP] Japan ................................. 54/31680

[51] Int. Cl.³ ............................................ G11C 27/02
[52] U.S. Cl. ..................................... 307/353; 307/82; 307/360; 328/151
[58] Field of Search ............................... 307/350–353, 307/360, 82, 200 A; 328/151; 361/91, 93

[56] References Cited

U.S. PATENT DOCUMENTS

| 3,717,818 | 2/1973 | Herbst | 307/353 |
| 4,010,385 | 3/1977 | Krol | 328/151 |
| 4,031,479 | 6/1977 | Thomas, Jr. et al. | 307/353 |
| 4,160,922 | 7/1979 | Rickenbacker | 307/353 |

OTHER PUBLICATIONS

General Electric Co., Catalog 4544K10-001, "Type 4701 Tranzducer for Voltage and Current Measurements", Oct. 1964, pp. 1, 3, 6–8.

Primary Examiner—John Zazworsky
Attorney, Agent, or Firm—Oblon, Fisher, Spivak, McClelland & Maier

[57] ABSTRACT

A relay device is disclosed which protects and controls an electric power line by detecting an electrical quantity carried by the electric power line. The relay device includes a rectifying circuit connected to the electric power line. The output of the rectifying circuit is supplied to a peak value holding circuit which stores the peak value of the output of the rectifying device during each predetermined period under control of a resetting pulse. The output of the peak value holding circuit is supplied to a detecting circuit having a predetermined threshold level.

20 Claims, 21 Drawing Figures

RELAY DEVICE

BACKGROUND OF THE INVENTION

1. Field of the Invention

This invention generally relates to a relay device which protects and controls an electric power line by detecting an electrical quantity carried by the electric power line.

2. Description of the Prior Art

In cases where the protection and controlling of the object to be controlled, such as a power line, is a function of an electrical quantity appearing on the power line, the sampling of the above-mentioned electrical quantity is achieved by using a conventional transducer.

Figure 1:
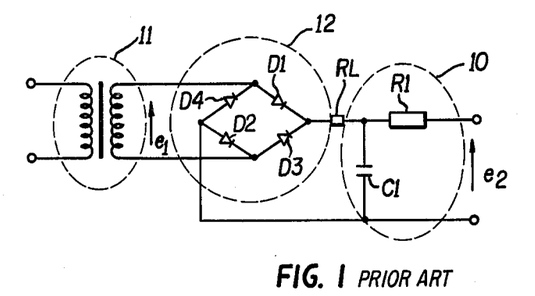
FIG. 1 is a circuit diagram of a conventional transducer.
Figure 2:
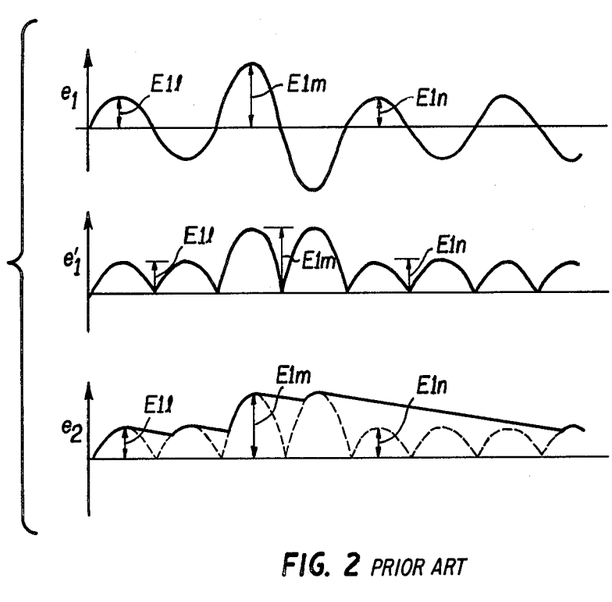
FIG. 2 is a timing chart showing the operation of the transducer shown in FIG. 1.

A typical circuit diagram of a conventional transducer is shown in FIG. 1, and waveforms of portions of the circuit shown in FIG. 1 are shown in FIG. 2.

In FIG. 1, an input AC electric quantity is converted by an input transformer 11 to the level $e_1$ which matches the circuit of the next stage.

The waveform $e_1$ in FIG. 2 is shown for illustrative purposes as having peak values of $E_{1l}$, $E_{1m}$, and $E_{1n}$ during successive cycles. The output $e_1$ of the input transformer 11 is full-wave rectified by a full-wave rectifying circuit 12 having four diodes $D_1$, $D_2$, $D_3$ and $D_4$. The rectified waveform is shown as $e_1'$ of FIG. 2.

The output $e_1'$ is supplied through a series resistance $R_L$ to a smoothing circuit 10 having a resistance $R_1$ and a capacitance $C_1$. The capacitance $C_1$ is charged until the input AC electric quantity reaches to its peak value. After the input AC quantity has passed its peak value, the diode $D_1$ of the full-wave rectifier 12 becomes turned OFF. Accordingly, the electric charge of the capacitance $C_1$ is discharged by the time constant determined by the capacitance $C_1$, the resistance $R_1$, and the resistance component of the load to be connected to the output of the transducer.

When the input quantity $e_1'$ increases sufficiently in amplitude to make the diode $D_1$ conductive, i.e. the amplitude of $e_1'$ exceeds the terminal voltage of the capacitance $C_1$, the capacitance $C_1$ is charged in accordance with the amplitude of the input quantity $e_1$. Accordingly, the peak value of the input quantity $e_1'$ is maintained in the capacitance $C_1$.

When the peak value of the input quantity changes from the value $E_{1l}$ to the value $E_{1m}$ ($E_{1l} < E_{1m}$), the output of the mentioned transducer rapidly changes in response to the change in the input quantity.

However, when the peak value of the input quantity changes from the value $E_{1m}$ to the value $E_{1n}$ ($E_{1m} > E_{1n}$), the response is delayed. Thus after the input quantity has reached the level of the peak value $E_{1m}$, the electric charge of the capacitance $C_1$ is discharged until the diode $D_1$ of the full-wave rectifying circuit 12 becomes conductive.

Until the discharging curve $e_2$, as shown in FIG. 2, reaches the next level after the peak value $E_{1n}$, the output $e_2$ of the transducer does not follow or detect the change of the input quantity $e_1'$. In the example of FIG. 2, the output of the transducer follows the changes in the input quantity with a delay of about two cycles.

It is understood that to reduce the ripple component of the output $e_2$, a large time constant for discharge is set by increasing the value of the capacitance $C_1$ or the resistance $R_1$. However, from the above-mentioned description it is easily understood that the transducer can not rapidly follow the changes in the input quantity.

Thus, it is impossible to provide high speed response in the relay device using a conventional transducer and thus it is also difficult to apply the relay device to an actual electric power line.

SUMMARY OF THE INVENTION

Accordingly, it is one object of this invention to provide a new and improved unique relay device which is high-speed responsive to changes in the input quantity.

Briefly, in accordance with one aspect of this invention, a relay device is provided which includes a converting circuit incorporating a rectifier circuit for rectifying an input AC electric quantity and a storage circuit for holding the peak value of the output of the rectifier circuit; a resetting circuit coupled to the storage circuit for periodically resetting the output of the storage circuit to zero; and a detector circuit coupled to detect the output of the storage circuit.

BRIEF DESCRIPTION OF THE DRAWINGS

A more complete appreciation of the invention will be readily obtained as the same becomes better understood by reference to the following detailed description when considered in connection with the accompanying drawings, wherein.

DETAILED DESCRIPTION OF THE PREFERRED EMBODIMENTS

Figure 3:
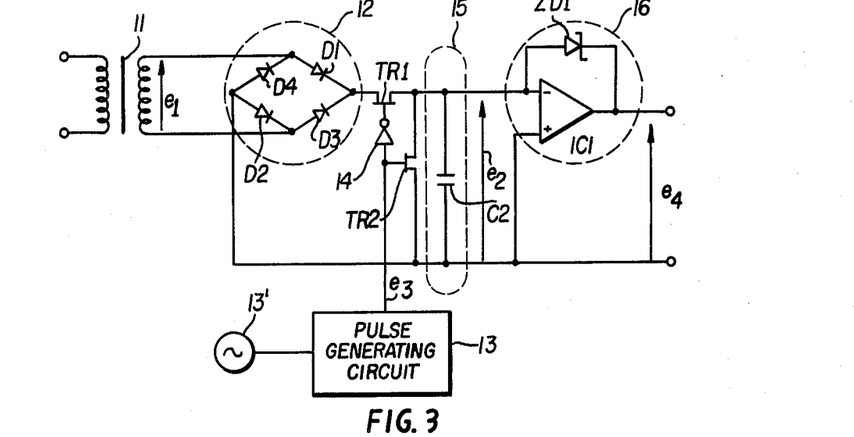
FIG. 3 is a circuit diagram of one embodiment of a relay device according to this invention.

Referring now to the drawings, wherein like reference numerals and letters designate identical or corresponding parts throughout the several views, and more particularly to FIG. 3 thereof, wherein one preferred embodiment of a relay device in accordance with this invention is shown as including a peak voltage holding circuit 15 which holds a peak voltage signal in a capacitance $C_2$.

The input AC electric quantity is converted by an input transformer 11 so as to match the level of the next stage circuit. The converted electric quantity $e_1$ is supplied to a full-wave rectifying circuit 12 having four diodes $D_1$ through $D_4$.

On the other hand, using a rectangular pulse generated by an oscillation 13', a pulse generating means or a pulse generating circuit 13 generates a pulse signal $e_3$ which acts as a resetting pulse signal (as hereinafter explained) for each constant period.

The output signal of the full-wave rectifying circuit 12 is supplied to a first field-effect transistor FET ($Tr_1$) which acts as a switching element and is supplied with the resetting pulse $e_3$ as an input gate signal through a NOT or inverter circuit 14.

The output signal of the FET ($Tr_1$) is supplied to the peak voltage holding circuit 15 having the capacitance $C_2$ to hold the peak voltage value of the input electric quantity signal. A second switching element, or field-effect transistor FET ($Tr_2$) is connected in parallel with both terminals of the capacitance $C_2$ to function as a discharge path for the electric charge in the capacitance $C_2$. The gate of the FET ($Tr_2$) is supplied by the resetting pulse $e_3$ as an input gate signal. Thus the electric charge in the capacitance $C_2$ is discharged by the resetting pulse signal $e_3$, which is generated in every constant period, through the field-effect transistor FET ($Tr_2$). When the level of the resetting pulse signal $e_3$ is high, the FET ($Tr_1$) is in the "OFF" state and the FET ($Tr_2$) is in the "ON" state. When the level of the resetting pulse signal $e_3$ is low, the FET ($Tr_1$) is in the "ON" state and the FET ($Tr_2$) is in the "OFF" state.

After the electric charge of the capacitance $C_2$ is discharged and the resulting pulse signal is extinguished, $C_2$ begins to charge to the peak value of the next cycle of the input electric quantity.

The output signal $e_2$ of the peak value holding circuit 15 is supplied to a detecting means, such as the level detector 16 having an operational amplifier $IC_1$ and a zener diode $ZD_1$, which is connected between the input and output terminals of the operational amplifier $IC_1$. The level detector 16 acts to compare the output signal $e_2$ with a predetermined value.

Figure 4:
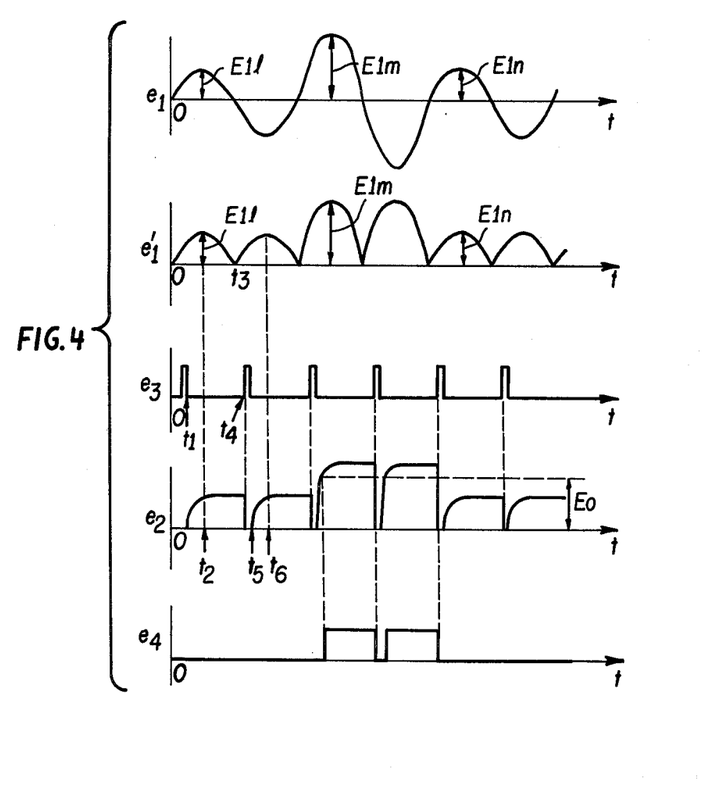
FIG. 4 is a timing chart showing the operation of the relay device shown in FIG. 3.

The operation of the embodiment of the invention shown in FIG. 3 is now explained with reference to FIG. 4. Similarly to FIG. 2, it is assumed that the converted electric quantity $e_1$, which is the output of the transformer 11, is changed to the peak values $E_{1l}$, $E_{1m}$ and $E_{1n}$ during subsequent cycles. The letter $e_1'$ represents the output wave signal of the full-wave rectifying circuit 12. The pulse signal $e_3$ is generated by the pulse generating circuit 13 by using the rectangular pulse signal of the oscillator 13'.

Figure 5:
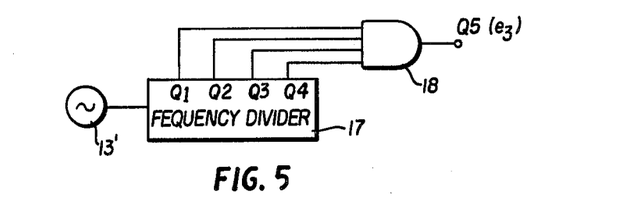
FIG. 5 is a circuit diagram of one embodiment of a pulse generating circuit shown in FIG. 3.
Figure 6:
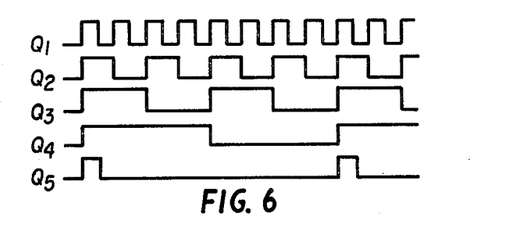
FIG. 6 is a timing chart showing the operation of the pulse generating circuit shown in FIG. 5.

One embodiment of the pulse generating circuit 13 is shown in FIG. 5 and the waveforms for each of its parts is shown in FIG. 6. The output signal (rectangular signal) of the oscillator 13' is divided by a frequency divider 17 so as to produce output signals $Q_1$, $Q_2$, $Q_3$ and $Q_4$ which are respectively twice, four times, eight times, and sixteen times the original period.

An AND circuit 18 adds the pulse signals $Q_1$ through $Q_4$ to produce the output pulse signal $Q_5$ as shown in FIG. 6. This signal $Q_5$ is represented as the voltage signal $e_3$ in FIG. 4.

The output signal of the full-wave rectifying circuit 12 is supplied to the peak value holding circuit 15 to hold the peak value of the input electric quantity through the field-effect transistor FET ($Tr_1$). By supplying the resetting pulse signal $e_3$ from the pulse generating circuit to the gate terminal of the field-effect transistor ($Tr_2$), the FET ($Tr_2$) is turned "ON". Accordingly the electric charge in the capacitance is rapidly discharged through the FET ($Tr_2$), and the output $e_2$ of the peak value holding circuit 15 is reset to the zero level.

At this time the above-mentioned discharging process is not affected by the output of the full-wave rectifying circuit 12 because of the "OFF" state of the field-effect transistor ($Tr_1$). This is described with reference to FIG. 4 which shows the waveform $e_2$ in detail. From the time point $t_1$ in which the resetting pulse signal $e_3$ is extinguished, the diodes $D_1$ and $D_2$ of the full-wave rectifying circuit 12 become conductive and the charging of the capacitance $C_2$ is commenced because the field-effect transistor ($Tr_1$) is then in the "ON" state. The charging is continued to the time point $t_2$ when the output signal $e_1'$ reaches the peak value $E_{1l}$. After that the diode $D_1$ becomes nonconductive and the capacitance $C_2$ continues to hold the peak value. At the time point $t_3$ the input signal $e_1$ changes to the negative half period. At the time point $t_4$ the resetting pulse signal $e_3$ of the pulse generating circuit 13 is supplied to the gate terminal of the field-effect transistor ($Tr_2$), and the voltage $e_2$ of the capacitance $C_2$ is reset to the zero level. From the time point $t_5$ when the resetting pulse signal is extinguished, the capacitance $C_2$ is charged through the diodes $D_3$ and $D_4$ and the charging is continued to the time point $t_6$ when the input wave signal $e_1$ reaches the negative peak value. Namely, during the period from time point $t_2$ to the time point $t_4$, the peak value of the input electric quantity continues to be held in the peak value holding circuit 15.

It is necessary that the resetting period be equal to or larger than a half period of the input AC electric quantity. In FIG. 4, the period $T_1$–$T_4$ is equal or smaller than the period $T_2$–$T_6$. It should be readily apparent that the operation in the case where the peak value of the input electric quantity changes from the peak value $E_{1m}$ to $E_{1n}$ is achieved similarly to the above-described operation.

Furthermore, whether the peak value held by the peak value holding circuit 15 exceeds a predetermined value (threshold level $E_o$) or not is determined by the detecting means, i.e. the level detector 16. The level detector 16 produces a final output signal $e_4$ when the held peak value, for example the value $E_{1m}$, is larger than the threshold level $E_o$.

Figure 7:
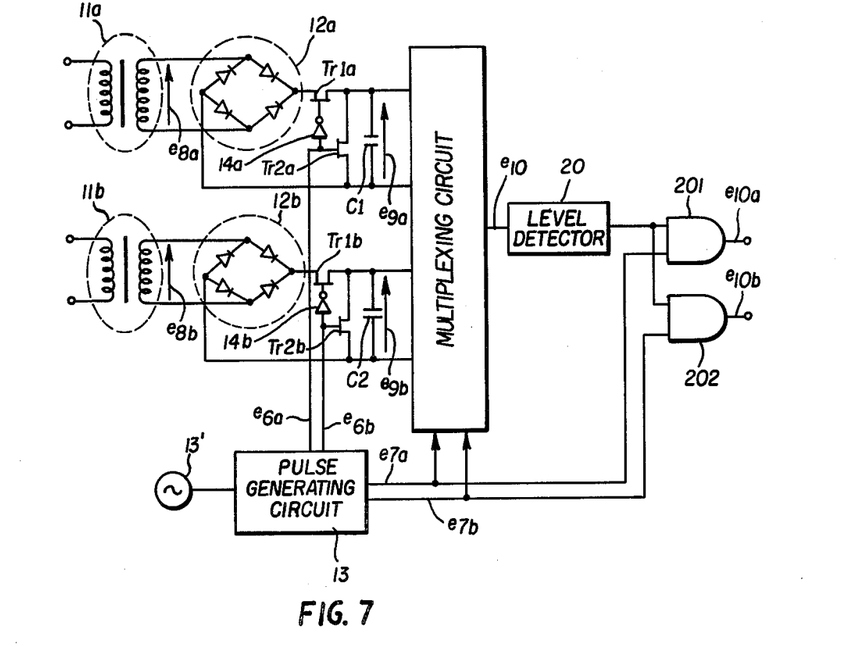
FIGS. 7, 9, 12, 13, 16, 18, 20 and 21 are circuit diagrams of other embodiments of the relay device according to this invention.

Referring now to FIG. 7, an alternative and preferred embodiment of this invention is shown as having two so-called converting circuits, each comprising an input transformer 11. A full-wave rectifying circuit 12 and a peak value holding circuit 15, as shown in FIG. 3, are connected in parallel with each other.

In FIG. 7, two different input electrical quantities $e_{8a}$ and $e_{8b}$ are supplied to respective input terminals of the two converting circuits. Both output signals of the converting circuits are supplied to a multiplexing circuit (MPX) 19 which multiplexes those signals. The output signal $e_{10}$ of the multiplexing circuit 19 is supplied to a level detector 20. As is well known, the multiplexing circuit is constituted so as to supply the corresponding output signals of the converter circuits to the input of the level detector 20 as controlled by using the signals $e_{7a}$ and $e_{7b}$ of the pulse generating circuit 13.

The resetting pulse signals $e_{6a}$ and $e_{6b}$ generated by the pulse generating circuits are respectively utilized as the resetting signals for the two outputs of the converting circuit. The period from the dropping of the resetting pulse signal to the raising of the next resetting pulse is set so as to be equal to or larger than a half period of the respective AC input electrical quantities.

Figure 8:
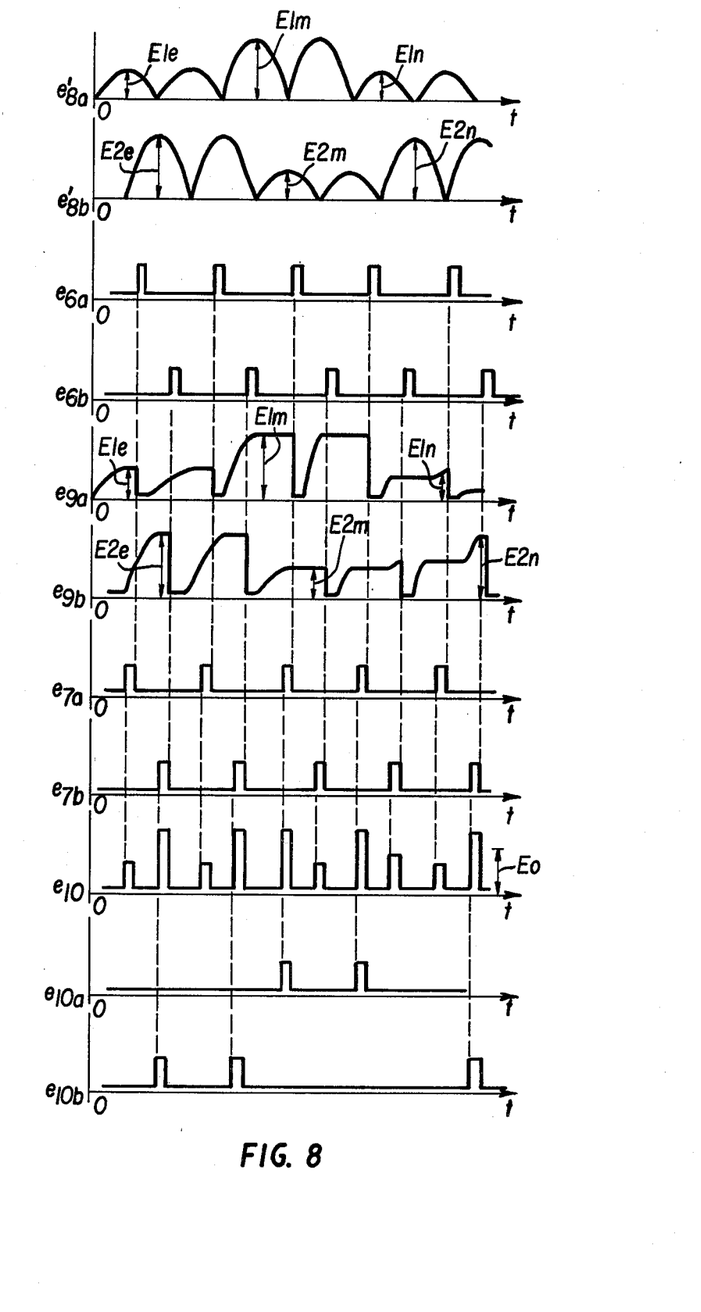
FIG. 8 is a timing chart showing the operation of the relay device shown in FIG. 7.

Furthermore the pulse generating circuit 13 produces the channel changing signals $e_{7a}$, $e_{7b}$ to the multiplexing circuit 19 to convert the two parallel input signals into one series signal. The time chart of each part shown in FIG. 7 is shown in FIG. 8. The symbols $e'_{8a}$ and $e'_{8b}$ represent the output waveforms of the full-wave rectifying circuits 12a and 12b. On the other hand the resetting pulse signals $e_{6a}$ and $e_{6b}$ of the pulse generating circuit 13 are supplied to each of the converting circuits. The symbols $e_{9a}$ and $e_{9b}$ represent the outputs of each converting circuit. The channel changing signals $e_{7a}$ and $e_{7b}$ for changing the channels of the multiplexing circuit 19 is supplied from the pulse generating circuit 13.

Figure 10:
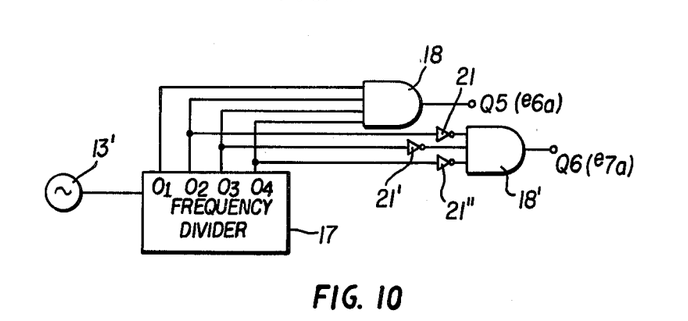
FIG. 10 is a circuit diagram of one embodiment of the pulse generating circuit shown in FIG. 7.
Figure 11:
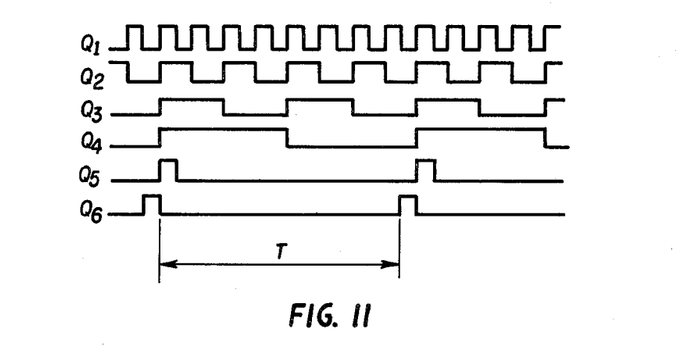
FIG. 11 is a timing chart showing the operation of the pulse generating circuit shown in FIG. 10.

It should now be apparent that it is necessary to generate the changing signals $e_{7a}$ and $e_{7b}$ such that the peak values of the input quantities $e_{8a}$ and $e_{8b}$ are exactly supplied to the multiplexing circuit 19. Namely, at the same time the input quantities are taken into the multiplexing circuit 19, the resetting pulse signal is generated, and the converting circuit is reset to store the peak value of the next cycle or period. One embodiment of the timing generating circuit is shown in FIG. 10. The timing chart of the timing generating circuit shown in FIG. 10 is shown in FIG. 11.

The signals $Q_5$ and $Q_6$ correspond to the signals $e_{6a}$ and $e_{7a}$ of FIG. 8, respectively. It is possible to exactly take the peak value of the input waveform into the converting circuit by setting the period T shown in FIG. 11 so as to be equal to or larger than a half period of the input AC electric quantity.

It is possible to select the width of the pulse signals $Q_5$ and $Q_6$ and space between the pulses by combining some gate circuits such as AND circuits 18 and 18' and NOT circuit 21, 21' and 21" in FIG. 10 and using the output signals of the frequency divider 17. Of course, the method of producing the signals $e_{6a}$, $e_{6b}$, $e_{7a}$ and $e_{7b}$ is not limited to the embodiment of FIG. 10.

The multiplexing circuit 19 can take both output signals of the converting circuits in a time sharing manner by the channel changing signals $e_{7a}$ and $e_{7b}$ to produce the output signal $e_{10}$.

The output signal $e_{10}$, as shown in FIG. 7, is supplied to respective input terminals of the AND circuits 201 and 202 along with the channel changing signals $e_{7a}$ and $e_{7b}$ of the pulse generating circuit 13. Only those portions of the output signal $e_{10}$ which exceed the threshold level $E_o$ appear in the output signals $e_{10a}$ and $e_{10b}$ of the AND circuits 201 and 202, respectively. Namely the input quantity from each object to be controlled is inputted to the converting circuit and control can be achieved by the level detector 20 in response to the amplitude of the input quantity.

Figure 9:
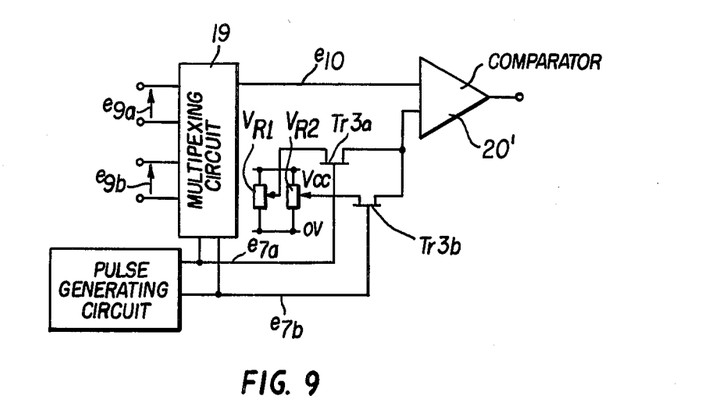

In FIG. 7, although two input quantities are detected by the level detector 20 having one threshold level, it is possible to detect each channel with a separate threshold level in accordance with the level of the input channel as shown in FIG. 9.

In FIG. 9, the channel changing signals $e_{7a}$ and $e_{7b}$, which are supplied to the multiplexing circuit 19, are supplied to the respective gates of the field-effect transistors $Tr_{3a}$ and $Tr_{3b}$ as gate signals. The detecting levels are determined or set by the variable resistances $V_{R1}$ and $V_{R2}$ connected between the potential terminals Vcc and 0 volt of the power source.

Accordingly, the field-effect transistor $Tr_3$ or $Tr_{3b}$ becomes conductive when the corresponding channel changing signal $e_{7a}$ or $e_{7b}$ is supplied to $Tr_3$ or $Tr_{3b}$, and whereby the corresponding detected level is supplied to one input terminal of a comparator 20' as shown in FIG. 9. Thus the added detected level is compared with the output signal $e_{10}$ of the multiplexing circuit 19.

Although the detected level can be changed in accordance with each input channel, it is not limited to the embodiment shown in FIG. 9.

Although in FIGS. 7 and 9, an embodiment is shown with two converting circuits for two input quantities, the same principal may be applied for three or more input quantities.

It should therefore be apparent that a detecting means, which has a low number of input quantities, can be constituted by providing a plurality of converting circuits, the number of which correspond to a number of the input quantities and by multiplexing their outputs with a multiplexing circuit.

Furthermore, although the resetting pulse signals $e_{6a}$ and $e_{6b}$ are independently supplied to the converting circuits, it is possible to reset all the converting circuits at the same time by a single or the same resetting pulse. In this case, it is necessary to set the resetting pulse so that it appears at the peak value of the input quantity appearing within the period from the falling of reset pulse to the rising of reset pulse signal of the next cycle.

Figure 12:
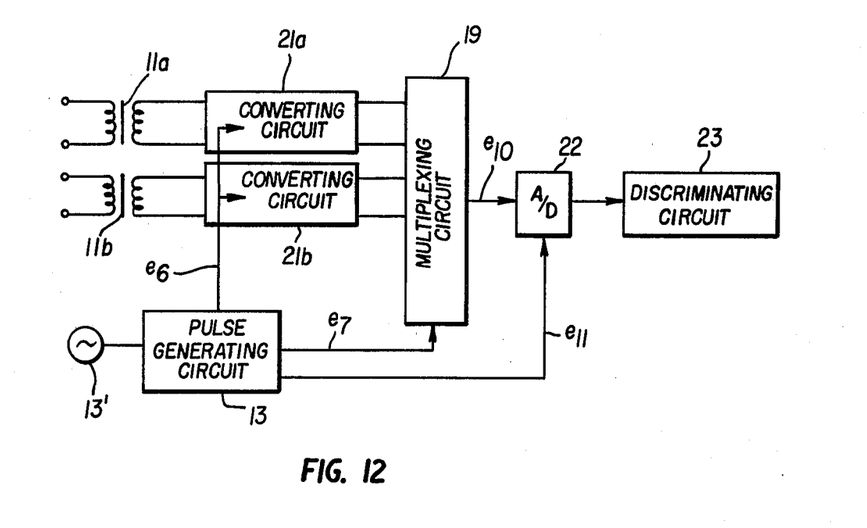

Referring now to FIG. 12, an analog to digital converter circuit (A/D) 22 is connected to the output terminal of the multiplexing circuit 19 shown in FIG. 7 and the converted digital output signal of the A/D converter circuit 22 is supplied to a discriminating circuit 23. The pulse generating circuit 13 supplies a resetting pulse signal $e_6$ to two converting circuits 21a and 21b, the channel changing signal $e_7$ to the multiplexing circuit 19, and a signal $e_{11}$ for starting the operation of the A/D converter. If it is assumed that the output signal $e_{10}$ is as shown in FIG. 8, the starting signal $e_{11}$ for the A/D converter is preferably generated at a predetermined time after the raising of each channel changing signal $e_7$ of the multiplexing circuit 19 (after the input quantity reaches its peak value).

In FIG. 12 the discriminating circuit 23 may be, for example, a micro computer device which executes the digital calculations and which produces a controlling output signal in response to the state of the input quantity.

Figure 13:
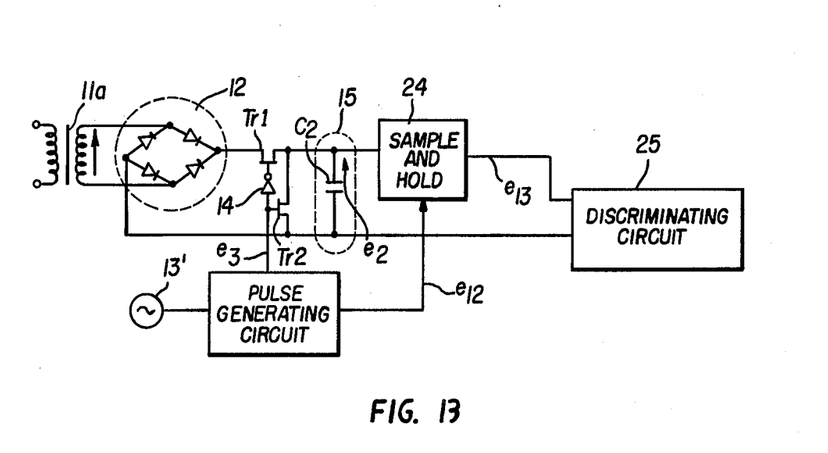

Referring now to FIG. 13, a sample and hold circuit 24 is provided at the output terminal of the peak value holding circuit 15 shown in FIG. 3. The output signal of the sample and hold circuit 24 is suppied to a discriminating circuit 25 to detect the level of the input quantity.

Figure 14:
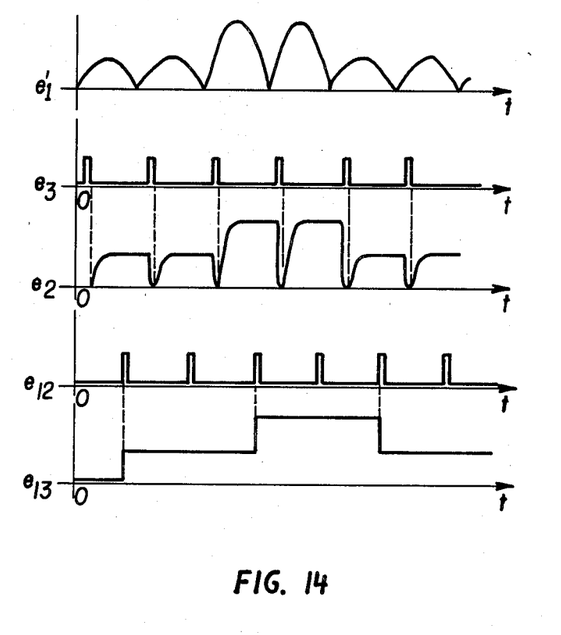
FIG. 14 is a timing chart showing the operation of the relay device shown in FIG. 13.

The sample and hold signal $e_{12}$ generated by the pulse generating circuit 13 corresponds to the signal $Q_6$ for the channel changing signal of the multiplexing circuit shown in FIG. 11. When the signal $e_{11}$ is at the high level, the output signal $e_2$ of the converting circuit is sampled and when the signal $e_{11}$ is at the low level, the output signal $e_2$ is held. Thus the sample and hold circuit 24 produces the output signal $e_{13}$. According to the embodiment shown in FIG. 13, since the DC output signal proportional to the amplitude of the input quantity is continuously available, as shown in FIG. 14, it is possible to continuous detect the output signal in a discriminating circuit 25. The discriminating circuit 25 is not limited to a circuit having an operational amplifier as shown in FIG. 3, but may be a circuit having level detecting function. Furthermore, although for convenience the present embodiment has been explained by using the field-effect transistors ($Tr_1$ and $Tr_2$) as resetting means, the embodiment is not limited to this method, but may be constituted in any equivalent manner so as to make the electric charge of the peak value holding circuit discharge in response to a commanding signal.

Figure 15:
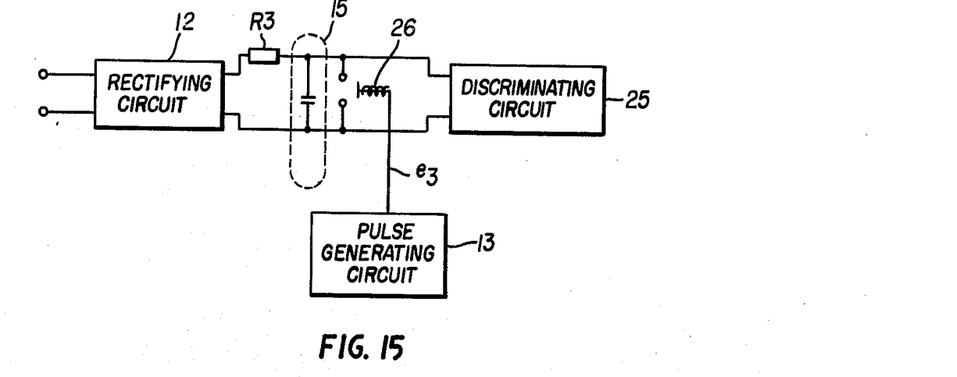
FIGS. 15 and 19 are circuit diagrams of other embodiments of the resetting circuit shown in FIG. 3.

Referring to FIG. 15, a relay device having a contact switched by the resetting pulse signal $e_3$ is connected between both terminals of the capacitance of the peak value holding circuit 15. The resistance $R_3$ is a current limiter for the contact of the relay element 26.

Figure 16:
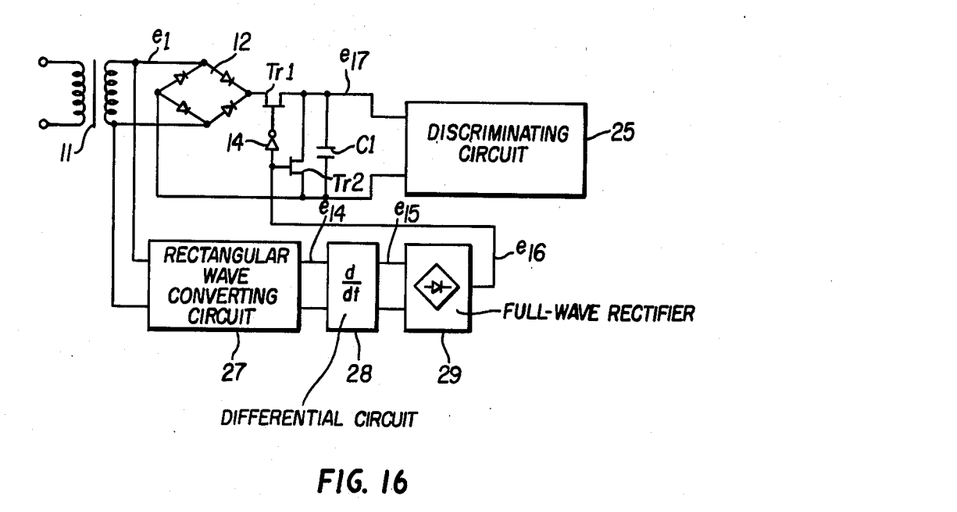
Figure 17:
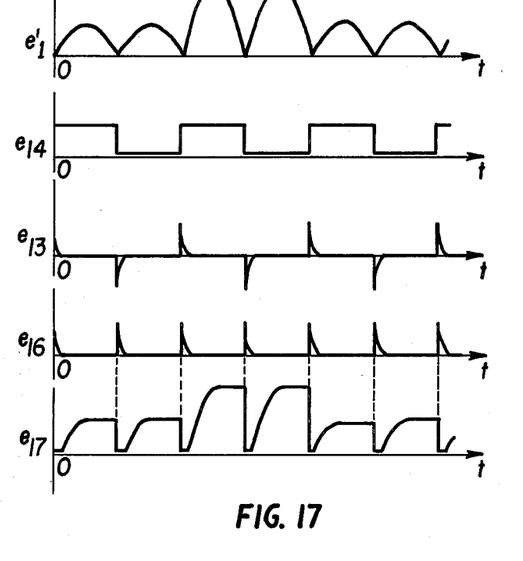
FIG. 17 is a timing chart showing the operation of the relay device shown in FIG. 16.

Moreover, it is not necessary to provide a pulse generating circuit 13 which generates pulse independent of the input electric quantity. The pulse generator can be constituted so as to generate the resetting pulse signal in accordance with the state of the input quantity. Referring now to FIG. 16, the zero point of the input quantity is detected by a rectangular wave converting circuit 27 which is connected to the input transformer 11 and which produces an output signal $e_{14}$. The output signal $e_{14}$ is supplied to a differential circuit 28 which produces a pulse $e_{15}$ on the raising and falling of the output signal $e_{14}$. As shown in FIG. 17, the output pulse $e_{15}$ of the differential circuit 28 is converted by a full-wave rectifying circuit 29 to a positive pulse signal $e_{16}$ which is the resetting pulse signal. Although in the embodiment of FIG. 16 the timing of the resetting is determined by the zero point of the input quantity, it can be constituted so as to determine the timing when the input quantity crosses a certain level.

Figure 18:
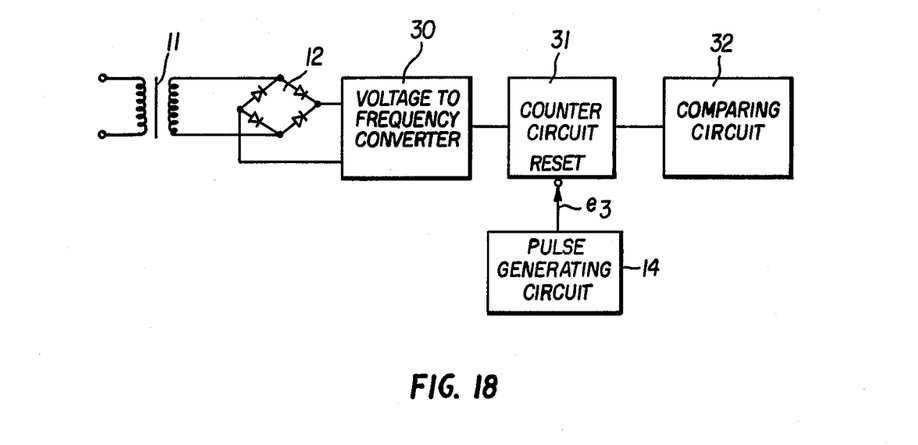

Referring now to FIG. 18, the output signal of the full-wave rectifying circuit 12 is supplied to a voltage to frequency converting circuit 30 which converts the input analogue quantity to a variable frequency pulse train. A counter circuit 31 having a resetting input terminal counts the number of pulses of the output of circuit 30. Although the counter 31 counts up in accordance with increases in frequency of the output of circuit 30, the counter 31 does not work when the frequency of input pulse train is decreasing. Namely, the counter 31 always stores the peak frequency of input pulse train and is reset by the resetting pulse signal $e_3$ from the pulse generating circuit 14. The period of the resetting pulse signal $e_3$, which is similar to the signal $e_3$ shown in FIG. 4, is set so as to exactly control the storage of the peak value of the input quantity within the resetting period whereby it is possible to provide the same function as the embodiment shown in FIG. 3. The output signal of the counter circuit 31 is supplied to a detecting means, or comparing means 32, which compares the output signal with a predetermined pulse train and produces an output signal.

Although the output signal of the transformer in the above-described embodiments is full-wave rectified and is discriminated, it is possible to obtain substantially the same function even though the output signal is half-wave rectified. However this has a disadvantage in that the discrimination is limited to one-half period of the input quantity.

Figure 19:
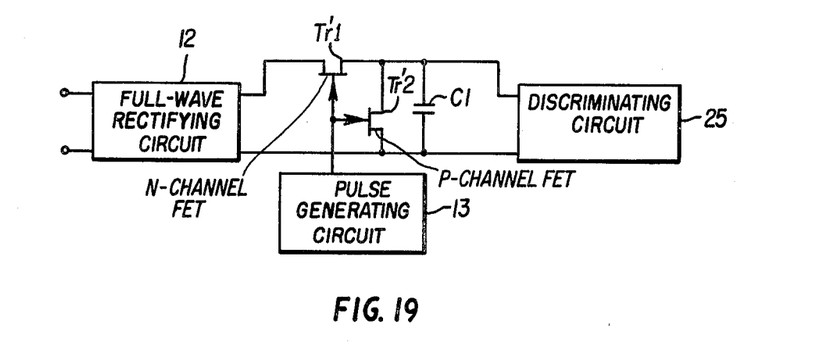

Referring now to FIG. 19, the NOT circuit 14 in the resetting circuit shown in FIGS. 3, 7, 13 and 16 can be deleted by combining an N-channel type field-effect transistor ($Tr_1'$) and a P-channel type field-effect transistor ($Tr_2'$). The switching means of $Tr_1'$ and $Tr_2'$ are not limited to field-effect transistors. It is possible to utilize other switching means such as, for example, transistors, or mechanical contactors.

In the above discussion, in the case where the input transformer 11 is a current transformer, it should be apparent that it is necessary to utilize a suitable resistance to prevent the failure of the secondary circuit of the current transformer.

Although in the above embodiment the peak value holding circuit 15 is periodically reset by the pulse generating circuit 13, it is not so limited. It can be constituted so as to hold the peak value of the input quantity for a predetermined time period.

Figure 20:
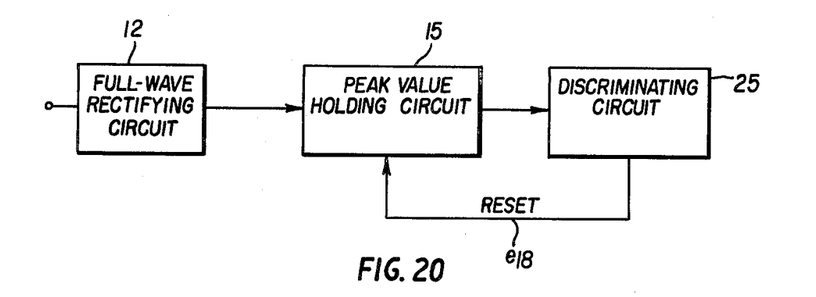

Referring to FIG. 20, after the output signal of the peak value holding circuit 15 is sent to the discriminating circuit 25, the discriminating circuit 25 produces a resetting signal $e_{18}$ for the peak value holding circuit 15. According to the data inputted to the discriminating circuit 25, the predetermined discriminating calculation is executed. At the time when the calculation is finished, the discriminating circuit 25 inputs the output signal of the peak value holding circuit 15.

Figure 21:
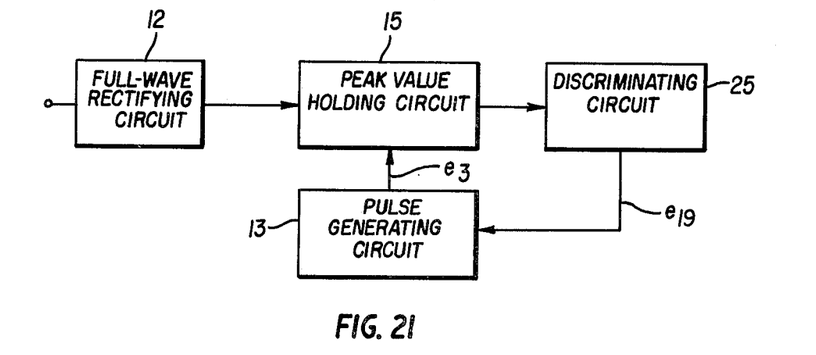

Referring to FIG. 21, the pulse generating circuit 13 is controlled by the resetting COMMAND signal $e_{19}$ from the discriminating circuit 25, whereby the resetting signal, which resets the peak value holding circuit 15, is produced by the pulse generating circuit 13.

It should now be apparent that in accordance with the teachings of this invention, an input electrical quantity is sampled at a low sampling rate to obtain a DC quantity which rapidly follows the amplitude of the input quantity. After the peak value of the sampled input quantity is held, the held value is reset, and the input quantity sampled and held again.

Accordingly, it is possible to rapidly detect changes in the input quantity. Moreover, it is economical to utilize hardware of low-cost because the collecting of the input quantity is executed at a low sampling rate (one sample corresponds to one cycle).

Furthermore since the input quantity is converted to digital numbers, such as by a digital type discriminating circuit, it is possible to interface the apparatus of the present invention with other digital devices such as a micro computer.

Current research is being conducted in the control and protection of electric power lines as a combined function by means of digital devices such as microprocessors. The present invention is useful in such research for rapidly determining the state of a power line under observation with high fidelity and at low cost. The present invention is compatible with other digital equipment.

Obviously, many modifications and variations of the present invention are possible in light of the teaching of the present invention.

It is therefore to be understood that within the scope of the appended claims, the invention may be practiced otherwise than as specifically described herein.

What is claimed as new and desired to be secured by Letters Patent of the United States is:

1. A relay device comprising:
   a rectifying circuit which rectifies an input AC electric quantity and produces a rectified output quantity;
   holding means connected to the rectifying circuit for holding the peak value of the rectified output quantity of the rectifying circuit;
   resetting means connected between the rectifying circuit and the holding means for resetting to a predetermined first level the held peak value of the holding means, said resetting means including a switching element connected to said holding means;

pulse generating means connected to the switching element for generating pulses to drive said switching element; and detecting means having an input coupled to the holding means for detecting the held peak value of the holding means and for producing an output at a predetermined second level if said held peak value exceeds a predetermined threshold voltage level, comprising an operational amplifier; and a zener diode connected between the input and the output terminals of the operational amplifier, said operation amplifier being coupled to the output of said holding means.

2. A relay device as recited in claim 1, wherein said holding means comprises a capacitance.

3. A relay device as recited in claim 1, which further comprises: an inverter circuit connected between said first and second switching elements wherein said switching elements switch alternately in response to the output of the pulse generating means.

4. A relay device comprising:
a rectifying circuit which rectifies an input AC electric quantity and produces a rectified output quantity;

holding means connected to the rectifying circuit for holding the peak value of the rectified output quantity of the rectifying circuit;

resetting means connected between the rectifying circuit and the holding means for resetting to a predetermined first level the held peak value of the holding means, said resetting means including a switching element connected to said holding means;

pulse generating means connected to the switching element for generating pulses to drive said switching element; and detecting means having an input coupled to the holding means for detecting the held peak value of the holding means and for producing an output at a predetermined second level if said held peak value exceeds a predetermined threshold voltage level;

wherein said pulse generating means comprises:
an oscillator;
a frequency divider means for dividing the output signal of the oscillator; and
means for adding the outputs from the frequency divider means.

5. A relay device comprising:
a plurality of converting circuits, each converting circuit including a rectifying circuit which rectifies an input AC electric quantity and produces a rectified output quantity signal and means for holding the peak value of the output quantity signal of the rectifying circuit;

means for resetting to a predetermined first level the peak value of the holding means;

means for multiplexing the output quantity signals of said plurality of converting circuits and providing a multiplexed signal at an output thereof; and means for detecting the output of said multiplexing means and for producing an output at a second predetermined level when the output of said multiplexing means exceeds a predetermined threshold voltage level.

6. A relay device as recited in claim 5, which further comprises:
a plurality of adding circuits which are connected with the output of the detecting means and which are supplied by a pulse signal having a predetermined order of pulses.

7. A relay device as recited in claim 6, wherein:
the resetting means, the multiplexing means, and said plurality of adding circuits are controlled by a common pulse generating circuit.

8. A relay device as recited in claim 5, wherein:
said detecting means has different adjustable threshold levels, one level corresponding to each input AC electric quantity.

9. A relay device as recited in claim 8, wherein said detecting means comprises:
a comparator having a first input coupled to the output of the multiplexing means;
a plurality of variable resistances, each setting a threshold voltage level corresponding to each input AC electric quantity; and
means for selectively connecting a second input of said comparator to the outputs of the plurality of variable resistances.

10. A relay device as recited in claim 5, which further comprises:
an analogue-to-digital converter provided between the output of said multiplexing means and the input of said detecting means.

11. A relay device comprising:
a rectifying circuit which rectifies an input AC electric quantity and produces a rectified output quantity;

holding means connected to the rectifying circuit for holding the peak value of the rectified output quantity of the rectifying circuit;

resetting means connected between the rectifying circuit and the holding means for resetting to a predetermined first level the held peak value of the holding means, said resetting means including a switching element connected to said holding means;

pulse generating means connected to the switching element for generating pulses to drive said switching element;

detecting means having an input coupled to the holding means for detecting the held peak value of the holding means and for producing an output at a predetermined second level if said held peak value exceeds a predetermined threshold voltage level; and means for sampling and holding the output of said holding means, said means for sampling and holding being provided between the output of said detecting means, said pulse generating circuit including means for generating pulses to control said sample and holding means.

12. A relay device comprising:
a rectifying circuit which rectifies an input AC electric quantity and produces a rectified output quantity;

holding means connected to the rectifying circuit for holding the peak value of the rectified output quantity of the rectifying circuit;

resetting means connected between the rectifying circuit and the holding means for resetting to a predetermined first level the held peak value of the holding means, said resetting means including a switching element connected to said holding means;

pulse generating means connected to the switching element for generating pulses to drive said switching element; and detecting means having an input coupled to the holding means for detecting the held peak value of the holding means and for producing an output at a predetermined second level if said held peak value exceeds a predetermined threshold voltage level;

wherein said resetting means is controlled by a signal in synchronism with the input AC electric quantity.

13. A relay device as recited in claim 12, wherein said resetting means comprises:

a rectangular wave converting circuit connected with the input AC electric quantity;

a differential circuit connected to the output terminal of the rectangular wave converting circuit for differentiating said rectangular wave; and an additional rectifying circuit coupled to the output of said differential circuit.

14. A relay device comprising:

a rectifying circuit for rectifying an input AC electric quantity;

means for converting the voltage of the output of the rectifying circuit to a signal having a frequency proportional to said voltage;

means for counting the frequency of the output of the converting means, said counting means having a reset terminal;

means for detecting the output of the counting means; and a pulse generator which produces a pulse to be supplied to the reset terminal of the counting means.

15. A relay device as recited in claim 14, wherein:

said counting means stores a number proportional to the peak value of said input AC electric quantity during a predetermined period.

16. A relay device comprising:

a rectifying circuit which rectifies an input AC electric quantity and produces a rectified output quantity;

holding means connected to the rectifying circuit for holding the peak value of the rectified output quantity of the rectifying circuit;

resetting means connected between the rectifying circuit and the holding means for resetting to a predetermined first level the held peak value of the holding means, said resetting means including a switching element connected to said holding means;

pulse generating means connected to the switching element for generating pulses to drive said switching element; and detecting means having an input coupled to the holding means for detecting the held peak value of the holding means and for producing an output at a predetermined second level if said held peak value exceeds a predetermined threshold voltage level;

wherein said resetting means is controlled by the detecting means.

17. A relay device comprising:

a rectifying circuit which rectifies an input AC electric quantity and produces a rectified output quantity;

holding means connected to the rectifying circuit for holding the peak value of the rectified output quantity of the rectifying circuit;

resetting means connected between the rectifying circuit and the holding means for resetting to a predetermined first level the held peak value of the holding means, said resetting means including a switching element connected to said holding means;

pulse generating means connected to the switching element for generating pulses to drive said switching element; and detecting means having an input coupled to the holding means for detecting the held peak value of the holding means and for producing an output at a predetermined second level if said held peak value exceeds a predetermined threshold voltage level;

wherein said pulse generating means is controlled by the output of the detecting means.

18. A relay device comprising:

a converting circuit including a rectifying circuit which rectifies an input AC electric quantity and means for holding a peak value of an output quantity of the rectifying circuit;

means for resetting to a predetermined first level the peak value of the holding means, said resetting means including a first switching element coupled between the output of the rectifying circuit and a first terminal of the holding means, a second switching element coupled between the first terminal and a second terminal of the holding means, and means for generating pulses to drive said first and second switching elements and means for detecting the output of the converting circuit and for producing an output at a predetermined second level when the output quantity rectifying circuit exceeds a predetermined threshold voltage level, said pulse generating means being controlled by the output of the detecting means.

19. A relay device comprising:

a rectifying circuit which rectifies an input AC electric quantity and produces a rectified output quantity;

holding means connected to the rectifying circuit for holding the peak value of the rectified output quantity of the rectifying circuit;

resetting means connected between the rectifying circuit and the holding means for resetting to a predetermined first level the held peak value of the holding means, said resetting means including a switching element connected to said holding means;

pulse generating means connected to the switching element for generating pulses to drive said switching element; and detecting means having an input coupled to the holding means for detecting the held peak value of the holding means and for producing an output at a predetermined second level if said held peak value exceeds a predetermined threshold voltage level;

wherein said resetting means further includes:

an additional switching element connected between the rectifying means and the holding means, said additional switching element being driven by said pulse generating mean.

20. A relay device as recited in claim 19, wherein:

said first switching element is an N-channel type field-effect transistor and said second switching element is a P-channel type field-effect transistor.

* * * * *